United States Patent [19]

Obeng

[11] Patent Number: 5,735,963
[45] Date of Patent: Apr. 7, 1998

[54] METHOD OF POLISHING

[75] Inventor: Yaw Samuel Obeng, Orlando, Fla.

[73] Assignee: Lucent Technologies Inc., Murray Hill, N.J.

[21] Appl. No.: 767,758

[22] Filed: Dec. 17, 1996

[51] Int. Cl.$^6$ ............................................. B08B 7/00
[52] U.S. Cl. ............................. 134/3; 134/2; 134/6; 134/7
[58] Field of Search ........................ 156/636, 1; 51/309; 139/3, 1.3, 2, 6, 7

[56] References Cited

U.S. PATENT DOCUMENTS

| | | | |
|---|---|---|---|
| 5,225,034 | 7/1993 | Yu et al. | 156/636.1 |
| 5,340,370 | 8/1994 | Cadien et al. | 51/308 |
| 5,354,490 | 10/1994 | Yu et al. | 252/79.1 |
| 5,527,423 | 6/1996 | Neville et al. | 156/636.1 |

OTHER PUBLICATIONS

Hydroxylamine Redox Properties of Hydroxylamines, Part 1. Inorganic Reactions M. Van Der Puy and J. H. Dimmit no date available.

Hydroxylamine Redox Properties of Hydroxylamines Part 2. Organic Reactions M. Van Der Puy no date available.

Oximes, Allied Signals no date available.

*Primary Examiner*—Jill Warden
*Assistant Examiner*—Alexander Markoff
*Attorney, Agent, or Firm*—John T. Rehberg

[57] ABSTRACT

A method for CMP of, illustratively, tungsten is disclosed. Hydroxylamine or hydroxylamine sulfate are employed to oxidize the metal, while gamma ($\gamma$) alumina is employed to abrade the oxidized metal.

6 Claims, No Drawings

METHOD OF POLISHING

TECHNICAL FIELD

This application relates in general, to methods of polishing, and more particularly, to methods of polishing semiconductor wafers having partially fabricated integrated circuits formed thereon.

BACKGROUND OF THE INVENTION

Chemical mechanical polishing (CMP) has become an increasingly popular technique in the fabrication of integrated circuits. The use of CMP permits the planarization of dielectric and metal layers, thereby facilitating the production of reliable multi-layer, multi-conductor integrated circuits.

A typical slurry recipe for the CMP of metallic films, e.g., tungsten and titanium nitride, include the use of colloided alumina and oxidant, e.g., $Fe(NO_3)_3$. The metal complex $Fe(NO_3)_3$ serves as an oxidant, oxidizing that outer portion of the tungsten which is in immediate contact with the slurry. The alumina functions as an abrasive, abrading away that outer portion of the tungsten which has already been oxidized.

Unfortunately, the metal ions (e.g. $Fe^{3+}/FE^{2+}$) of the metal oxidant tend to create stains (reddish stains from $Fe^{2+}$) which disrupt the functioning of optical sensors within the polishing tool set, and more importantly, disposal of the waste slurry with its metal oxide residue, presents environmental problems.

Those concerned with the development of integrated circuit technology, have consistently sought better methods of performing CMP.

SUMMARY OF THE INVENTION

Illustratively, a method of polishing a material including exposing the material to a slurry which an abrasive, and an organic oxidant, said oxidant being chosen from the group consisting of hydroxylamine and its derivatives.

DETAILED DESCRIPTION

The present invention addresses the above mentioned concerns and others, by replacing metal oxidants, e.g. the $Fe(NO_3)_3$ with a variety of organic oxidants which are essentially consumed during the CMP process or at least which do not present the environmental issues posed by $Fe(NO_3)_3$. In an illustrative embodiment, $Fe(NO_3)_3$ may be replaced by a wafer soluble organic oxidant with a reduction potential greater than 0.16V/NHE (normal hydrogen electrode), for example, hydroxylamine, $NH_2OH$. (Hydroxylamine may be either an oxidant or a reductant, depending upon the pH of the solution. When the pH is low, e.g. 1–2, hydroxylamine is an oxidant.) Hydroxylamine may be substituted for $Fe(NO_3)_3$, thereby oxidizing the metal so that it may be subsequently removed by the abrasive component of the slurry.

Thus, the oxidation reaction which occurs when hydroxylamine is employed as an oxidant may be depicted as:

$$M^{n+} + NH_2OH \rightarrow M^{(n+1)+} + NH_3\uparrow + H_2O \qquad (pH<<7.0)$$

For example, using titanium, e.g.

For tungsten,

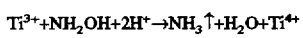

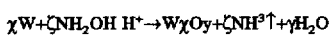

Thus, ammonia is driven off as a harmless product and there are no environmental disposal concerns associated with iron residue from $Fe(NO_3)_3$ and/or related compounds.

A few illustrative hydroxylamines derivatives suitable for CMP applications are given by the formulas:

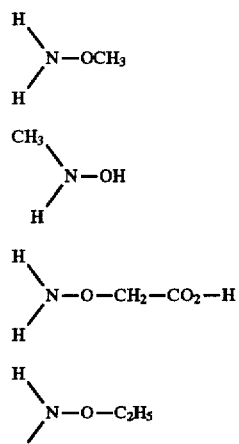

and in general,

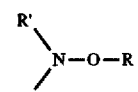

where $R = R' = R'' = H$ or $R \neq R' \neq R$

Another illustrative embodiment includes the use of hydroxylamine sulfate $(NH_2OH)_2\ H_2\ SO_4$ as an oxidizing agent.

In an illustrative formulation, a slurry for CMP might contain:

0.1–20% Weight/Volume of gamma (γ) alumina 0.1–20% Weight/Volume of hydroxylamine (or hydroxylamine sulfate)

0.1–20% Weight/Volume complexing agent, e.g. EDTA, Catechol, Thiophenols, etc.

0.1–20% Weight/Volume non-ionic surfactant. Balance inert, aqeous buffer to adjust pH, etc.

Hydroxylamines are readily obtained from, for example, Allied Signal, Morristown, N.J.

What is claimed is:

1. A method of polishing a material comprising:
   exposing said material to a slurry which contains an abrasive and an organic oxidant being hydroxylamine.

2. The method of claim 1 wherein said abrasive is γ alumina.

3. The method of claim 1 wherein the pH of said slurry is acidic.

4. The method of claim 3 wherein the pH of said slurry is between 1 and 2.

5. The method of claim 1 in which said slurry contains
   0.1–20% Weight/Volume alumina
   0.1–20% Weight/Volume oxidant
   0.1–20% Weight/Volume complexing agent and
   0.1–20% Weight/Volume non-ionic surfactant.

6. A method of polishing a material comprising:
   exposing said material to a slurry which contains an abrasive and an organic oxidant, said organic oxidant being chosen from the groups consisting of

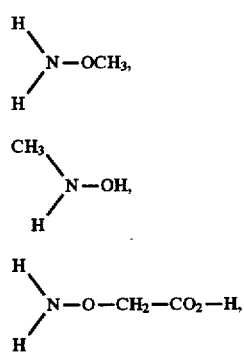
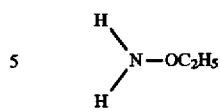
and hydroxylamine sulfate.
* * * * *